(12) United States Patent
Zheng et al.

(10) Patent No.: US 12,463,601 B2
(45) Date of Patent: Nov. 4, 2025

(54) DUAL-BAND LOW-NOISE AMPLIFIER CIRCUIT, LOW-NOISE AMPLIFIER, AND DEVICE

(71) Applicant: SMARTER MICROELECTRONICS (GUANG ZHOU) CO., LTD., Guangzhou (CN)

(72) Inventors: Yaohua Zheng, Guangzhou (CN); Minjun He, Guangzhou (CN); Ping Li, Guangzhou (CN); Qiang Su, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 509 days.

(21) Appl. No.: 18/064,263

(22) Filed: Dec. 10, 2022

(65) Prior Publication Data

US 2023/0108382 A1    Apr. 6, 2023

Related U.S. Application Data

(63) Continuation of application No. PCT/CN2021/102683, filed on Jun. 28, 2021.

(30) Foreign Application Priority Data

Aug. 7, 2020   (CN) .......................... 202010790745.8

(51) Int. Cl.
 H03F 3/19    (2006.01)
 H03F 1/56    (2006.01)

(52) U.S. Cl.
 CPC .............. *H03F 3/19* (2013.01); *H03F 1/565* (2013.01); *H03F 2200/222* (2013.01); *H03F 2200/294* (2013.01); *H03F 2200/387* (2013.01); *H03F 2200/451* (2013.01)

(58) Field of Classification Search
 USPC ................. 330/282, 283, 285, 305, 311, 296
 See application file for complete search history.

(56) References Cited

U.S. PATENT DOCUMENTS

| | | | | |
|---|---|---|---|---|
| 9,407,215 | B2* | 8/2016 | Gill | H03F 3/193 |
| 10,432,238 | B1* | 10/2019 | Luo | H04B 1/18 |
| 10,715,085 | B2* | 7/2020 | Kobayashi | H03F 3/193 |
| 2018/0358938 | A1* | 12/2018 | Ayranci | H03H 7/38 |

* cited by examiner

*Primary Examiner* — Andrea Lindgren Baltzell
*Assistant Examiner* — Nareh Shamiryan
(74) *Attorney, Agent, or Firm* — Syncoda LLC; Feng Ma

(57) ABSTRACT

A dual-band low-noise amplifier circuit includes an amplification sub-circuit and a switch frequency selection circuit; the amplification sub-circuit is used for performing gain amplification on a radio frequency signal to be amplified to obtain an amplified radio frequency signal, and outputting the amplified radio frequency signal; the switch frequency selection circuit is connected to the amplification sub-circuit, and is used for controlling the state of a switch in the switch frequency selection circuit on the basis of a target frequency band corresponding to the radio frequency signal to be amplified, so that the dual-band low-noise amplifier circuit meets optimal performance in the target frequency band. In this way, low-noise amplification of dual-band signals is achieved by means of the reconfigurable structure of the low-noise amplifier circuit, and parameters such as noise figure, gain, and linearity can be kept in optimal states in each frequency band.

9 Claims, 6 Drawing Sheets

DUAL-BAND LOW-NOISE AMPLIFIER CIRCUIT, LOW-NOISE AMPLIFIER, AND DEVICE

CROSS-REFERENCE TO RELATED APPLICATIONS

This is a continuation of International Patent Application No. PCT/CN2021/102683 filed on Jun. 28, 2021, which claims priority to Chinese Patent Application No. 202010790745.8 filed on Aug. 7, 2020. The disclosures of the above-referenced applications are hereby incorporated by reference in their entirety.

BACKGROUND

With the development of a Fifth Generation (5G) mobile communication technology, selectable wireless spectrums gradually become diverse. At this time, electronic devices such as a smart phone, a palmtop computer, a personal digital assistant (PDA) or the like are required to support operation under multi-band. However, it is required for a radio frequency (RF) receiver of an electronic device to support not only multi-band, but also multi-channel reception, which requires higher and higher integration level of the RF receiver, furthermore, complexity of the RF receiver is increasing.

A low-noise amplifier is the most critical part in the RF receiver. However, in a current related technical solution, a low-noise amplifier in a receiver supporting multi-band requires a large number of components, which is not conducive to high integration level and has high cost. Furthermore, in a current design, a noise coefficient and gain may be sacrificed to obtain broadband characteristics, which is not conducive to achieving optimal performance in each band.

SUMMARY

The disclosure relates to the technical field of integrated circuit (IC), and in particular to a dual-band low-noise amplifier circuit, a low-noise amplifier, and a device.

Embodiments of the disclosure provide a dual-band low-noise amplifier circuit, a low-noise amplifier, and a device. Low-noise amplification of a dual-band signal may be achieved by reconfiguration of a switch frequency selection circuit, furthermore, it may also be achieved that performance of noise coefficient, gain, linearity or the like are in optimal states in each band.

Technical solutions of the embodiments of the disclosure are implemented as follows.

In a first aspect, an embodiment of the disclosure provides a dual-band low-noise amplifier circuit, including an amplification sub-circuit and a switch frequency selection circuit.

The amplification sub-circuit is configured to perform gain amplification on a to-be-amplified RF signal to obtain an amplified RF signal, and output the amplified RF signal.

The switch frequency selection circuit is connected to the amplification sub-circuit, and is configured to control a state of a switch in the switch frequency selection circuit based on a target band corresponding to the to-be-amplified RF signal, such that the dual-band low-noise amplifier circuit meets optimal performance in the target band.

In some embodiments, the switch frequency selection circuit may include an input matching sub-circuit, an output matching sub-circuit and a degradation inductor sub-circuit.

The input matching sub-circuit is connected to an input end of the amplification sub-circuit, and is configured to select an input matching mode corresponding to the target band, and transmit the to-be-amplified RF signal into the amplification sub-circuit based on the input matching mode.

The output matching sub-circuit is connected to an output end of the amplification sub-circuit, and is configured to select an output matching mode corresponding to the target band, and transmit the amplified RF signal based on the output matching mode.

The degradation inductor sub-circuit is connected to the input end of the amplification sub-circuit, and is configured to select a degradation inductor mode corresponding to the target band, and perform the gain amplification on the to-be-amplified RF signal by cooperating with the amplification sub-circuit based on the degradation inductor mode.

In some embodiments, in response to the target band being a high frequency:

the input matching sub-circuit may select a first input mode, and transmit the to-be-amplified RF signal into the amplification sub-circuit based on the first input mode;

the output matching sub-circuit may select a first output mode, and transmit the amplified RF signal based on the first output mode; and the degradation inductor sub-circuit may select a first degradation inductor mode, and perform the gain amplification on the to-be-amplified RF signal by cooperating with the amplification sub-circuit based on the first degradation inductor mode.

In some embodiments, in response to the target band being a low frequency:

the input matching sub-circuit may select a second input mode, and transmit the to-be-amplified RF signal into the amplification sub-circuit based on the second input mode;

the output matching sub-circuit may select a second output mode, and transmit the amplified RF signal based on the second output mode; and the degradation inductor sub-circuit may select a second degradation inductor mode, and perform the gain amplification on the to-be-amplified RF signal by cooperating with the amplification sub-circuit based on the second degradation inductor mode.

In some embodiments, the input matching sub-circuit may include at least a first inductor and a first bypass switch, here the first inductor may be controlled to be in a bypass or normal state by controlling a closed or opening state of the first bypass switch.

In some embodiments, in response to the first bypass switch being in the closed state, it may be confirmed that the input matching sub-circuit is in the first input mode; or in response to the first bypass switch being in the opening state, it may be confirmed that the input matching sub-circuit is in the second input mode.

In some embodiments, the degradation inductor sub-circuit may include at least a second inductor and a second bypass switch, here the second inductor may be controlled to be in a bypass or normal state by controlling a closed or opening state of the second bypass switch.

In some embodiments, in response to the second bypass switch being in the closed state, it may be confirmed that the degradation inductor sub-circuit is in the first degradation inductor mode; or in response to the second bypass switch being in the opening state, it may be confirmed that the degradation inductor sub-circuit is in the second degradation inductor mode.

In some embodiments, the output matching sub-circuit may include at least a choke capacitor component and an output capacitor component.

The choke capacitor component includes at least a choke inductor and a third capacitor bank connected in parallel, here the third capacitor bank includes at least a third capacitor and a third connection switch configured to control electrical parameters by which the third capacitor bank affects the choke capacitor component.

The output capacitor component includes a fourth capacitor and a fifth capacitor bank connected in series, here the fifth capacitor bank includes at least a fifth capacitor and a fourth connection switch configured to control electrical parameters by which the fifth capacitor bank affects the output capacitor component.

In some embodiments, in response to the third connection switch being in an opening state and the fourth connection switch being in a closed state, it may be confirmed that the output matching sub-circuit is in the first output mode; or in response to the third connection switch being in a closed state and the fourth connection switch being in an opening state, it may be confirmed that the output matching sub-circuit is in the second output mode.

In some embodiments, the dual-band low-noise amplifier circuit may further include a direct current (DC) blocking capacitor connected between the input matching sub-circuit and the amplification sub-circuit.

In some embodiments, the amplification sub-circuit may include two amplification transistors connected through a cascode structure.

In a second aspect, an embodiment of the disclosure provides a low-noise amplifier, including at least the dual-band low-noise amplifier circuit as described in the first aspect.

In a third aspect, an embodiment of the disclosure provides an electronic device, including at least the low-noise amplifier as described in the second aspect.

Embodiments of the disclosure provide a dual-band low-noise amplifier circuit, a low-noise amplifier, and a device, the dual-band low-noise amplifier circuit includes an amplification sub-circuit and a switch frequency selection circuit. The amplification sub-circuit is configured to perform gain amplification on a to-be-amplified RF signal to obtain an amplified RF signal, and output the amplified RF signal. The switch frequency selection circuit is connected to the amplification sub-circuit, and is configured to control a state of a switch in the switch frequency selection circuit based on a target band corresponding to the to-be-amplified RF signal, such that the dual-band low-noise amplifier circuit meets optimal performance in the target band. In this way, low-noise amplification of a dual-band signal may be achieved by a reconfigurable structure of the dual-band low-noise amplifier circuit, furthermore, it may be achieved that parameters such as noise coefficient, gain, linearity or the like are in optimal states in each band.

DETAILED DESCRIPTION

Figure 1:
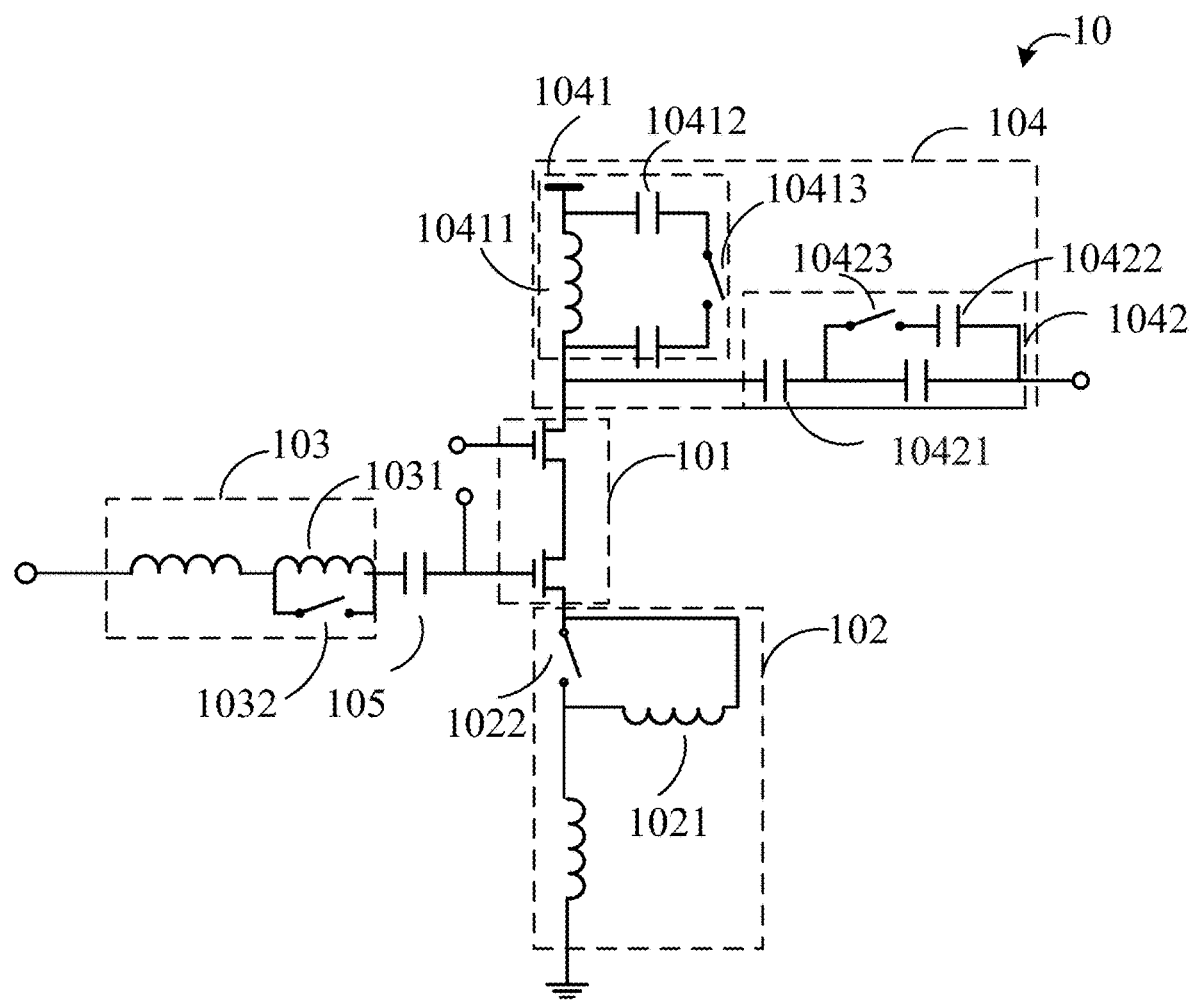
FIG. 1 is a schematic structural diagram of a dual-band low-noise amplifier circuit provided by an embodiment of the disclosure.

The technical solutions in the embodiments of the disclosure will be described clearly and completely below with reference to the accompanying drawings in the embodiments of the disclosure.

With the development of a 5G mobile communication technology, selectable wireless spectrums become diverse, and then, a mobile terminal is required to support operation under multi-band. In this way, it is required for a RF receiver of the terminal to support not only multi-band, but also multi-channel reception, which requires higher and higher integration level of the RF receiver of the terminal, furthermore, complexity of the RF receiver of the terminal is increasing.

A low-noise amplifier refers to an amplifier with a low noise coefficient. Generally, it is used as a high frequency or intermediate frequency pre-amplifier in various radio receivers, and is used as an amplification circuit in an electronic detecting device with high sensitivity. The low-noise amplifier is the most critical part in the RF receiver, there are mainly two methods for a conventional receiver supporting multi-band to require a low-noise amplifier to do. One method is to require an independent low-noise amplifier for each band to amplify a received signal, and the low-noise amplifier for each band may implement optimal noise coefficient, gain and linearity for each band. Another method is to require a broadband low-noise amplifier supporting multi-band amplification, so that received signals in multiple bands may be amplified.

However, disadvantages of the above methods of the low-noise amplifier required by the receiver supporting multi-band lie in that:

(1) Each band requires an independent low-noise amplifier, such that a number of low-noise amplifiers with the best performance in narrow band may be proportional to a number of bands and channels, resulting in a large number of components, which is not conducive to high integration level and has high cost;

(2) Multi-band amplification is performed by the broadband low-noise amplifier. In design, the broadband low-noise amplifier usually sacrifices a noise coefficient and gain to obtain broadband characteristics, which is not conducive to achieving optimal performance in each band, including optimal performance of noise coefficient, gain and linearity.

An adjustable source degradation inductor is a circuit including at least one inductor which is used to degrade a gain transistor and has a variable inductance.

A noise coefficient is used to measure a noise level of an amplifier itself. This coefficient is a parameter characterizing a deterioration degree of noise performance of the amplifier, and is not advantageous as the coefficient becoming larger. The larger a value of the coefficient, the greater noise incorporated in a transmission process, which reflects unsatisfactory characteristics of a channel or a device.

Based on the above, an embodiment of the disclosure provides a dual-band low-noise amplifier circuit, including an amplification sub-circuit and a degradation inductor sub-circuit. The amplification sub-circuit is configured to perform gain amplification on a to-be-amplified RF signal to obtain an amplified RF signal, and output the amplified RF signal. The degradation inductor sub-circuit is connected to the amplification sub-circuit, and is configured to select a degradation inductor mode corresponding to the to-be-amplified RF signal, and perform the gain amplification on the to-be-amplified RF signal by cooperating with the amplification sub-circuit based on the degradation inductor mode. In this way, low-noise amplification of a dual-band signal may be achieved by a reconfigurable structure of the low-noise amplifier circuit, furthermore, it may be achieved that parameters such as noise coefficient, gain, linearity or the like are in optimal states in each band.

The disclosure is described in further detail below with reference to the accompanying drawings and specific embodiments.

An embodiment of the disclosure provides a dual-band low-noise amplifier circuit 10. Referring to FIG. 1, it shows a schematic structural diagram of a dual-band low-noise amplifier circuit 10 provided by an embodiment of the disclosure, and as shown in FIG. 1, the dual-band low-noise amplifier circuit 10 includes an amplification sub-circuit 101 and a switch frequency selection circuit.

The amplification sub-circuit 101 is configured to perform gain amplification on a to-be-amplified RF signal to obtain an amplified RF signal, and output the amplified RF signal.

The switch frequency selection circuit is connected to the amplification sub-circuit 101, and is configured to control a state of a switch in the switch frequency selection circuit based on a target band corresponding to the to-be-amplified RF signal, such that the dual-band low-noise amplifier circuit meets optimal performance in the target band.

It should be noted that the dual-band low-noise amplifier circuit 10 is capable of performing low-noise amplification on an input RF signal, and mainly includes the amplification sub-circuit 101 and the switch frequency selection circuit. The amplification sub-circuit 101 is a transistor for achieving signal amplification in essence, and mainly plays a role of performing gain amplification on the to-be-amplified RF signal. The switch frequency selection circuit is reconfigurable, and gain amplification of to-be-amplified RF signals in different bands performed by the dual-band low-noise amplifier circuit may be in the optimal performance by controlling the state of the switch in the switch frequency selection circuit.

It should also be noted that a number of transistors included in the amplification sub-circuit 101 is varied according to actual requirements. When two amplification transistors are included in the amplification sub-circuit 101, then a cascode structure may be adopted. Therefore, in some embodiments, the amplification sub-circuit 101 includes two amplification transistors connected through a cascode structure.

Furthermore, when the amplification sub-circuit 101 includes at least three amplification transistors, then these amplification transistors may be connected in a manner of stacked transistors (i.e. a cascade structure). Therefore, in some embodiments, the amplification circuit includes at least three amplification transistors connected through a cascade structure.

That is, an amplification transistor generally includes three pins, namely a source, a gate and a drain. When the amplification sub-circuit 101 includes two amplification transistors as shown in FIG. 1, then the two amplification transistors may be connected through a cascade structure of a cascode type. When the amplification sub-circuit 101 includes three or more amplification transistors, then these transistors need to be connected in a manner of stacked transistors.

In this way, the switch in the switch frequency selection circuit has different states for the to-be-amplified RF signals in different bands, such that amplification of the to-be-amplified RF signals performed by the dual-band low-noise amplifier circuit is in a optimal state.

Furthermore, the switch frequency selection circuit may include an input matching sub-circuit 103, an output matching sub-circuit 104 and a degradation inductor sub-circuit 102.

The input matching sub-circuit 103 is connected to an input end of the amplification sub-circuit 101, and is configured to select an input matching mode corresponding to the target band, and transmit the to-be-amplified RF signal into the amplification sub-circuit 101 based on the input matching mode.

The output matching sub-circuit 104 is connected to an output end of the amplification sub-circuit 101, and is configured to select an output matching mode corresponding to the target band, and transmit the amplified RF signal based on the output matching mode.

The degradation inductor sub-circuit 102 is connected to the input end of the amplification sub-circuit 101, and is configured to select a degradation inductor mode corresponding to the target band, and perform the gain amplification on the to-be-amplified RF signal by cooperating with the amplification sub-circuit based on the degradation inductor mode.

It should be noted that the degradation inductor sub-circuit 102 is a reconfigurable source degradation inductor component in essence, and has a main function of providing a reconfigurable degradation inductance to the amplification sub-circuit 101. Specifically, the degradation inductor sub-circuit 102 may provide different degradation inductance to the amplification sub-circuit 101 in different degradation inductor modes, so as to perform gain amplification on a to-be-amplified RF signal with a high or low frequency by cooperating with the amplification sub-circuit 101.

It should be noted that performance of the whole circuit is related to impedance matching of the circuit, wrong impedance matching may make the circuit unstable, and reduce efficiency of the circuit and increase nonlinearity of the circuit. Therefore, the dual-band low-noise amplifier circuit 10 further includes the input matching sub-circuit 103 and the output matching sub-circuit 104 which provide appropriate impedance to transmit corresponding RF signals respectively. Since an input signal of the dual-band low-noise amplifier may be either in a high band or in a low band, the input matching sub-circuit 103 and the output matching sub-circuit 104 also include different modes.

Specifically, an input matching mode corresponding to the to-be-amplified RF signal may be selected in the input matching sub-circuit 103, so as to transmit the to-be-amplified RF signal with appropriate impedance. An input matching mode corresponding to the amplified RF signal may be selected in the output matching sub-circuit 104, so as to transmit the amplified RF signal with appropriate impedance.

To sum up, the dual-band low-noise amplifier circuit 10 may include four sub-circuits, i.e., the input matching sub-circuit 103, the amplifier sub-circuit, the degradation inductor sub-circuit 102 and the output matching sub-circuit 104. The amplifier sub-circuit performs amplification of the to-be-amplified RF signal, and the input matching sub-circuit 103, the degradation inductor sub-circuit 102 and the output matching sub-circuit 104 perform functions of input matching, matching amplification and output matching with the RF signal through modes corresponding to the RF signal respectively.

It should also be noted that the to-be-amplified RF signal may be a high-frequency signal. Therefore, in some embodiments, in response to the target band being a high frequency:

the input matching sub-circuit 103 may select a first input mode, and transmit the to-be-amplified RF signal into the amplification sub-circuit 101 based on the first input mode;

the output matching sub-circuit 104 may select a first output mode, and transmit the amplified RF signal based on the first output mode; and the degradation inductor sub-circuit 102 may select a first degradation inductor mode, and perform the gain amplification on the to-be-amplified RF signal by cooperating with the amplification sub-circuit 101 based on the first degradation inductor mode.

Furthermore, the to-be-amplified RF signal may also be a low-frequency signal. Therefore, in some embodiments, in response to the target band being a low frequency:

the input matching sub-circuit 103 may select a second input mode, and transmit the to-be-amplified RF signal into the amplification sub-circuit 101 based on the second input mode;

the output matching sub-circuit 104 may select a second output mode, and transmit the amplified RF signal based on the second output mode; and the degradation inductor sub-circuit 102 may select a second degradation inductor mode, and perform the gain amplification on the to-be-amplified RF signal by cooperating with the amplification sub-circuit 101 based on the second degradation inductor mode.

It should be noted that in addition to the amplification sub-circuit 101, each sub-circuit of the reconfigurable frequency selection circuit includes at least two circuit modes by changing the state of the switch in the reconfigurable frequency selection circuit. Specifically, when the input matching sub-circuit 103 selects the first input mode, the degradation inductor sub-circuit 102 selects the first degradation inductor mode and the output matching sub-circuit 104 selects the first output mode, the whole dual-band low-noise amplification circuit may perform amplification of the high-frequency signal. When the input matching sub-circuit 103 selects the second input mode, the degradation inductor sub-circuit 102 selects the second degradation inductor mode and the output matching sub-circuit 104 selects the second output mode, the whole dual-band low-noise amplification circuit may perform amplification of the low-frequency signal.

In a specific design, the input matching sub-circuit 103 may include at least a first inductor 1031 and a first bypass switch 1032, here the first inductor 1031 may be controlled to be in a bypass or normal state by controlling a closed or opening state of the first bypass switch 1032.

It should be noted that the input matching sub-circuit 103 includes at least the first inductor 1031 and the first bypass switch 1032, and the first inductor 1031 may be bypassed by the first bypass switch 1032 when the first bypass switch 1032 is closed. That is, when the first bypass switch 1032 is in the opening state, the first inductor 1031 is a part of the input matching sub-circuit 103, and circuit parameters of the first inductor 1031 may affect circuit parameters of the input matching sub-circuit 103. However, the first inductor 1031 is bypassed when the first bypass switch 1032 is closed, then the first inductor 1031 no longer affects the circuit parameters of the input matching sub-circuit 103.

Furthermore, the input matching sub-circuit 103 may also include other specific elements according to actual usage requirements, such as other inductors which are fixedly connected, or other switches, which are not elaborated here.

In this way, a connection state of the first inductor 1031 may be adjusted flexibly by controlling the first bypass switch 1032, and specific circuit parameters of the input matching sub-circuit 103 may also be adjusted flexibly. Therefore, in some embodiments, in response to the first bypass switch 1032 being in the closed state, it may be confirmed that the input matching sub-circuit 103 is in the first input mode; or, in response to the first bypass switch 1032 being in the opening state, it may be confirmed that the input matching sub-circuit 103 is in the second input mode.

That is, when the first bypass switch 1032 is in the closed state, the first inductor 1031 is bypassed and the input matching sub-circuit 103 is in the first input mode, which may provide input impedance corresponding to the high-frequency signal. When the first bypass switch 1032 is in the opening state, the first inductor 1031 is in the connection state and the input matching sub-circuit 103 is in the second input mode, which may provide input impedance corresponding to the low-frequency signal.

In a specific design, the degradation inductor sub-circuit 102 may include at least a second inductor 1021 and a second bypass switch 1022, here the second inductor 1021 may be controlled to be in a bypass or normal state by controlling a closed or opening state of the second bypass switch 1022.

It should be noted that the degradation inductor sub-circuit 102 includes the second inductor 1021 and the second bypass switch 1022, and the second inductor 1021 may be bypassed by the second bypass switch 1022 when the second bypass switch 1022 is closed. That is, when the second bypass switch 1022 is in the opening state, the second inductor 1021 is a part of the degradation inductor sub-circuit 102, and circuit parameters of the second inductor may affect circuit parameters of the degradation inductor sub-circuit 102. However, when the second bypass switch 1022 is closed, the second inductor 1021 is bypassed, then the second inductor 1021 no longer affects the circuit parameters of the degradation inductor sub-circuit 102.

Furthermore, the degradation inductor sub-circuit 102 may also include other specific elements according to actual usage requirements, such as other inductors which are fixedly connected, or other switches, which are not elaborated here.

In this way, a connection state of the second inductor 1021 may be adjusted flexibly by controlling the second bypass switch 1022, and specific circuit parameters of the degradation inductor sub-circuit 102 may also be adjusted flexibly. Therefore, in some embodiments, in response to the second bypass switch 1022 being in the closed state, it may be confirmed that the degradation inductor sub-circuit 102 is in the first degradation inductor mode; or in response to the second bypass switch 1022 being in the opening state, it may be confirmed that the degradation inductor sub-circuit 102 is in the second degradation inductor mode.

That is, when the second bypass switch 1022 is in the closed state, the second inductor 1021 is bypassed and the degradation inductor sub-circuit 102 is in the first degradation inductor mode, which may provide degradation inductance corresponding to the high-frequency signal to the amplification sub-circuit 101, such that the amplification sub-circuit 101 may provide appropriate gain coefficient and noise coefficient to a high-frequency RF signal, achieving low-noise amplification of the to-be-amplified RF signal. When the second bypass switch 1022 is in the opening state, the second inductor 1021 is in the connection state and the degradation inductor sub-circuit 102 is in the second degradation inductor mode, which may provide degradation inductance corresponding to the low-frequency signal to the amplification sub-circuit 101, such that the amplification sub-circuit 101 may provide appropriate gain coefficient and noise coefficient to a low-frequency RF signal, achieving low-noise amplification of the to-be-amplified RF signal.

In a specific design, the output matching sub-circuit 104 may include at least a choke capacitor component 1041 and an output capacitor component 1042.

The choke capacitor component 1041 includes at least a choke inductor 10411 and a third capacitor bank connected in parallel, here the third capacitor bank includes at least a third capacitor 10412 and a third connection switch 10413 configured to control electrical parameters by which the third capacitor bank affects the choke capacitor component 1041.

The output capacitor component 1042 includes at least a fourth capacitor 10421 and a fifth capacitor bank connected in series, here the fifth capacitor bank includes a fifth capacitor 10422 and a fourth connection switch 10423 configured to control electrical parameters by which the fifth capacitor bank affects the output capacitor component 1042.

It should be noted that the output matching sub-circuit 104 includes two parts, i.e. the choke capacitor component 1041 and the output capacitor component 1042, and the choke inductor 10411 and the third capacitor bank are connected in parallel.

The choke capacitor component 1041 includes the choke inductor 10411 and the third capacitor bank which are in a parallel state, and the third capacitor bank is provided with the third capacitor 10412 and the third connection switch 10413, and the third connection switch 10413 is capable of controlling electrical parameters by which the third capacitor bank affects the choke capacitor component. That is, when the third connection switch 10413 is closed, circuit parameters of the third capacitor bank affect electrical components of the choke capacitor component 1041. When the third connection switch 10413 is opened, the circuit parameters of the third capacitor bank do not affect the electrical components of the choke capacitor component 1041.

The output capacitor component 1042 includes the fourth capacitor 10421 and the fifth capacitor bank connected in series, and the fifth capacitor bank includes the fifth capacitor 10422 and the fourth connection switch 10423, then the fourth connection switch 10423 mainly controls electrical parameters by which the fifth capacitor bank affects the output capacitor component 1042. That is, when the fourth connection switch 10423 is closed, performance parameters of the fifth capacitor bank affect circuit parameters of the output capacitor component 1042 due to presence of the fifth capacitor 10422. When the fourth connection switch 10423 is closed, the fifth capacitor 10422 does not affect circuit parameters of the fifth capacitor bank, and thus the performance parameters of the fifth capacitor bank do not affect the circuit parameters of the output capacitor component 1042.

Furthermore, the output matching sub-circuit 104 may also include other specific elements according to actual usage requirements, such as other inductors which are fixedly connected, or other switches, which are not elaborated here.

In this way, specific circuit parameters of the output matching sub-circuit 104 may be adjusted flexibly by controlling the third connection switch 10413 and the fourth connection switch 10423. Therefore, in some embodiments, in response to the third connection switch 10413 being in an opening state and the fourth connection switch 10423 being in an opening state, it may be confirmed that the output matching sub-circuit 104 is in the first output mode; or, in response to the third connection switch 10413 being in a closed state and the fourth connection switch 10423 being in a closed state, it may be confirmed that the output matching sub-circuit 104 is in the second output mode.

That is, when the third connection switch 10413 is in the closed state and the fourth connection switch 10423 is in the closed state, the output matching sub-circuit 104 is in the first output mode, which may provide output impedance corresponding to the high-frequency signal. When the third connection switch 10413 is in the opening state and the fourth connection switch 10423 is in the opening state, the output matching sub-circuit 104 is in the second output mode, which may provide output impedance corresponding to the low-frequency signal.

Furthermore, in some embodiments, the dual-band low-noise amplifier circuit 10 may further include a DC blocking capacitor 105 connected between the input matching sub-circuit 103 and the amplification sub-circuit 101.

It should be noted that the dual-band low-noise amplifier circuit 10 also requires the DC blocking capacitor 105 which is mainly used for DC blocking process of the RF signal and is connected between the input matching sub-circuit 103 and the amplification sub-circuit 101.

To sum up, the reconfigurable dual-band low-noise amplifier circuit 10 proposed in the embodiment of the disclosure is simple to implement, conducive for integration and saves layout area. A single low-noise amplifier achieves dual frequency through reconfiguration, and optimizes performance of noise coefficient, gain, linearity or the like in each band pertinently. Furthermore, the reconfigurable method may be applied to a multi-band low-noise amplifier.

Based on the above, the embodiment of the disclosure provides a dual-band low-noise amplifier circuit, including an amplification sub-circuit and a switch frequency selection circuit. The amplification sub-circuit is configured to perform gain amplification on a to-be-amplified RF signal to obtain an amplified RF signal, and output the amplified RF signal. The switch frequency selection circuit is connected to the amplification sub-circuit, and is configured to control a state of a switch in the switch frequency selection circuit based on a target band corresponding to the to-be-amplified RF signal, such that the dual-band low-noise amplifier circuit meets optimal performance in the target band. In this way, low-noise amplification of a dual-band signal may be achieved by a reconfigurable structure of the low-noise amplifier circuit, furthermore, it may be achieved that parameters such as noise coefficient, gain, linearity or the like are in optimal states in each band.

Figure 2:
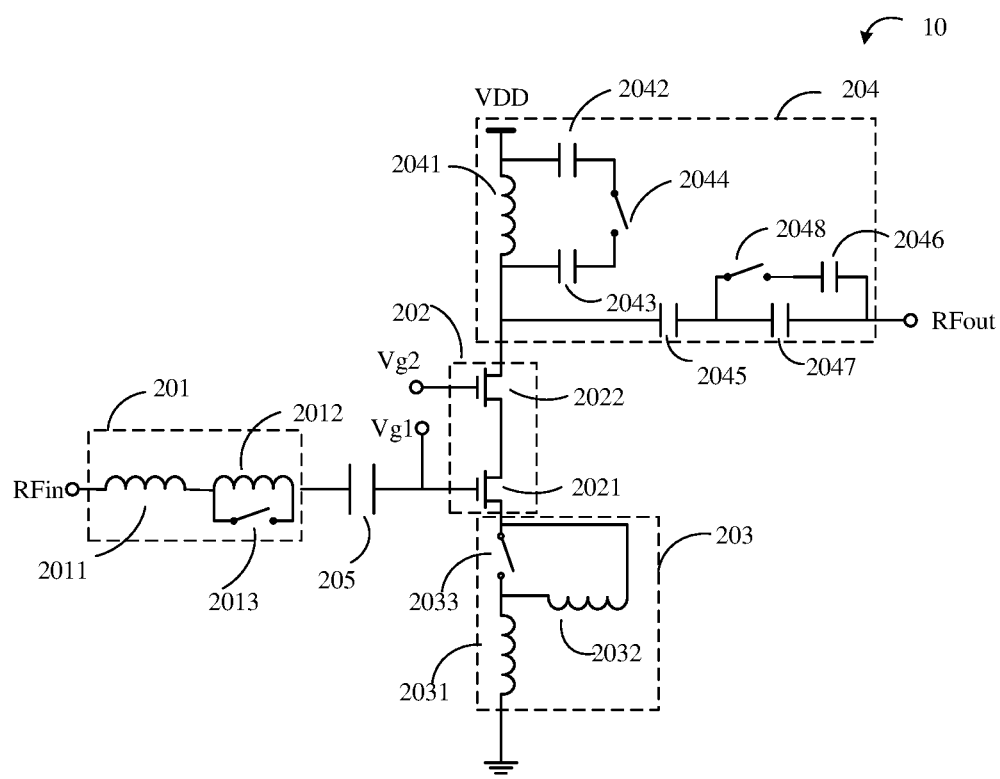
FIG. 2 is a schematic structural diagram of another dual-band low-noise amplifier circuit provided by an embodiment of the disclosure.

In yet another embodiment of the disclosure, referring to FIG. 2, it shows a schematic structural diagram of another dual-band low-noise amplifier circuit 10 provided by an embodiment of the disclosure, and as shown in FIG. 2, the dual-band low-noise amplifier circuit 10 includes an adjustable input matching part 201 (equivalent to the aforementioned input matching sub-circuit), an amplification transistor part 202 (equivalent to the aforementioned amplification sub-circuit), an adjustable source degradation inductor part 203 (equivalent to the aforementioned degradation inductor sub-circuit), an adjustable output matching part 204 (equivalent to the aforementioned output matching sub-circuit), and a DC blocking capacitor 205.

The adjustable input matching part 201 includes an inductor 2011, an inductor 2012 and a switch 2013, here one end of the inductor 2011 is a signal input end and the other end of the inductor 2011 is connected in series with the inductor 2012. Furthermore, the inductor 2012 may be bypassed by the switch 2013.

The amplification transistor part 202 includes an amplification transistor 2021 and an amplification transistor 2022 connected through a cascode structure. Furthermore, according to actual needs, the amplification transistor 2021 and the amplification transistor 2022 are additionally provided with separate bias voltages which are Vg1 and Vg2, respectively.

The DC blocking capacitor 205 is arranged between the adjustable input matching part 201 and the amplification transistor part 202. Specifically, one end of the DC blocking capacitor 205 is connected to the inductor 2012, and the other end of the DC blocking capacitor 205 is connected to a source of the amplification tube 2021.

The adjustable bias voltage part 203 includes an inductor 2031, an inductor 2032 and a switch 2033, here one end of the inductor 2031 is grounded, and the other end of the inductor 2031 is connected in series with the inductor 2032, and the other end of the switch 2033 is connected to the amplification transistor 2021. Furthermore, the inductor 2032 may be bypassed by the switch 2033.

The adjustable output matching part 204 includes a first part and a second part, here the first part includes a choke inductor 2041, a capacitor 2042, a capacitor 2043 and a switch 2044. The capacitor 2042 and the capacitor 2043 are connected in series and then they are connected in parallel with the choke inductor 2041, and the switch 204 or the like are arranged between the capacitor 2042 and the capacitor 2043. The second part includes a capacitor 2045, a capacitor 2046, a capacitor 2047 and a switch 2048. The capacitor 2046 and the capacitor 2047 are connected in parallel and then they are connected in series with the capacitor 2045, and the switch 2048 is arranged on a branch of the capacitor 2046, the first part and the second part are in a parallel state. Specifically, one end of the choke inductor 2041 is connected to the amplification transistor 2022, and the other end of the choke inductor 2041 is connected to a positive electrode, and the other end of the capacitor 2047 may output the amplified RF signal.

That is, the dual-band low-noise amplifier circuit 10 includes the amplification transistor part 202, the adjustable source degradation inductor part 203, the adjustable input matching part 201 and the adjustable output matching part 204. The adjustable input matching part 201 has two inductors connected in series, one of the inductors may be bypassed by a switch, such that increase or decrease of input inductance may be achieved. The choke inductor of the adjustable output matching part 204 is a part of output matching, furthermore, the choke inductor is connected in parallel with the capacitor, and the capacitor may be switched by a switch, such that increase or decrease of equivalent inductance of the choke inductor and the parallel-connected capacitor may be achieved. Furthermore, the adjustable output matching part 204 is further divided into output capacitors, of which two capacitors connected in parallel may be switched by a switch, and then are connected in series with another capacitor, such that increase or decrease of capacitance of the output capacitor may be achieved. The adjustable source degradation inductor part has two inductors connected in series, here one of the inductors may be bypassed by a switch, such that increase or decrease of inductance of the source degradation inductor may be achieved. The amplification transistor part 202 may be of a conventional cascode structure or may be of multiple of stacked transistors. The adjustable input matching part 201 and the adjustable source degradation inductor part 203 operate together to achieve better matching of noise coefficient in each corresponding band, while the adjustable output matching part 204 may achieve better gain and linearity in each corresponding band.

Figure 3:
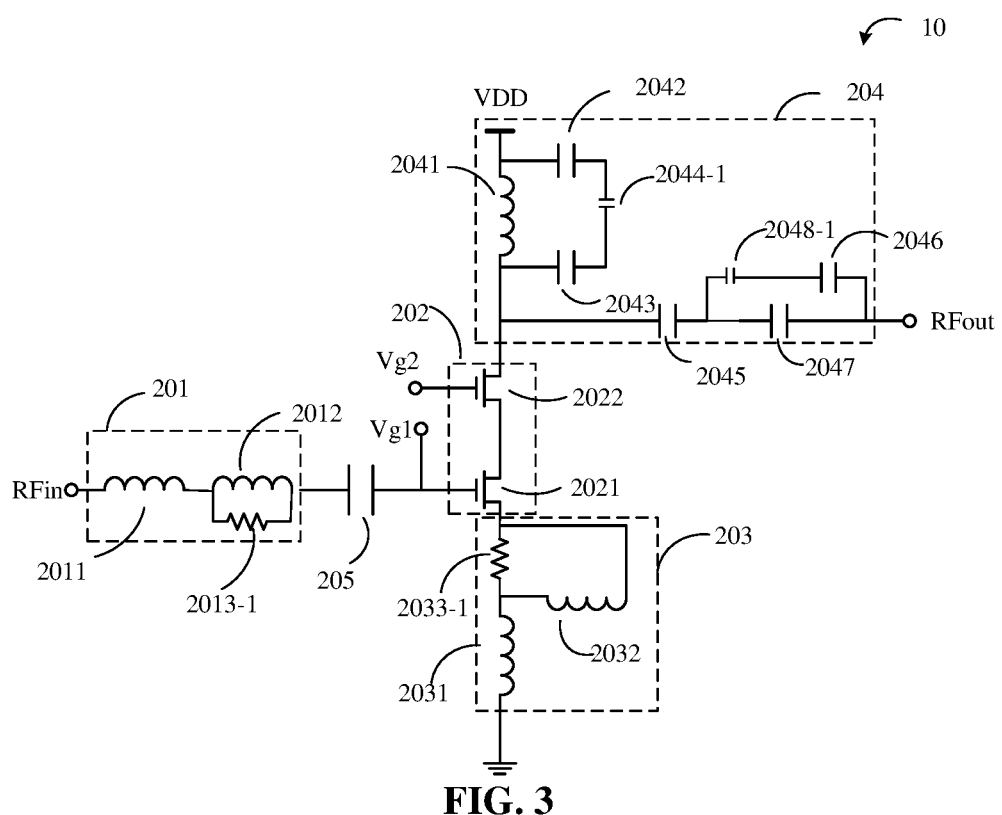
FIG. 3 is a first schematic diagram of an equivalent circuit of a dual-band low-noise amplifier circuit provided by an embodiment of the disclosure.

When the dual-band low-noise amplifier circuit 10 operates at a high frequency, referring to FIG. 3, it shows a first schematic diagram of an equivalent circuit of a dual-band low-noise amplifier circuit provided by an embodiment of the disclosure. As shown in FIG. 3, the switch 2013 in the adjustable input matching part 201 is opened to form an equivalent resistor 2013-1 having a small equivalent resistance, the equivalent resistor 2013-1 is connected in parallel with the inductor 2012 and then connected in series with the inductor 2011, in this way, a total inductance may be equivalent to the inductor 2011. The switch 2044 in the adjustable output matching part 204 is closed to form an equivalent capacitor 2044-1 having a small equivalent capacitance, the equivalent capacitor 2044-1 is connected in series with the capacitor 2042 and the capacitor 2043 and then connected in parallel with the choke inductor 2041, in this way, a total inductance may be equivalent to the choke inductor 2041. Furthermore, the switch 2048 is closed to form an equivalent capacitor 2048-1 having a small equivalent capacitance, the equivalent capacitor 2048-1 is connected in series with the capacitor 2046 and then connected in parallel with the capacitor 2047 and then connected in series with the capacitor 2045, in this way, a total capacitance may be equivalent to a parallel combination of the capacitor 2045 and the capacitor 2047. The switch 2033 in the adjustable source degradation inductor part 203 is opened to form an equivalent resistor 2033-1 having a small equivalent resistance, the equivalent resistor 2013-1 is connected in parallel with the inductor 2032 and then connected in series with the inductor 2031, in this way, a total inductance may be equivalent to the inductor 2031. In this way, the adjustable input matching part 201 and the adjustable source degradation inductor part 203 operate together to achieve better matching of noise coefficient in a high band, while the adjustable output matching part 204 may achieve better gain and linearity in a high band.

Figure 4:
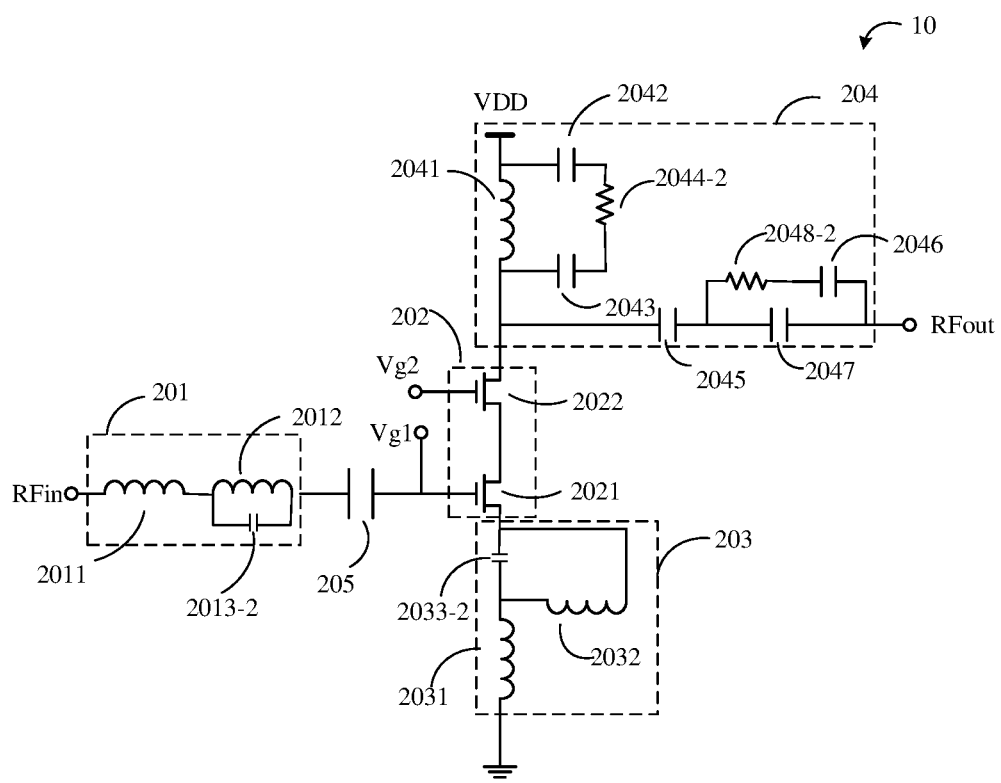
FIG. 4 is a second schematic diagram of an equivalent circuit of a dual-band low-noise amplifier circuit provided by an embodiment of the disclosure.

When the reconfigurable dual-band low-noise amplifier circuit 10 operates at a low frequency, referring to FIG. 4, it shows a second schematic diagram of an equivalent circuit of a dual-band low-noise amplifier circuit provided by an embodiment of the disclosure. As shown in FIG. 4, the switch 2013 in the adjustable input matching part 201 is closed to form a capacitor 2013-2 having a small equivalent capacitance, the equivalent capacitor 2013-2 is connected in parallel with the inductor 2012 and then connected in series with the inductor 2011, in this way, a total inductance may be equivalent to superposition of the inductor 2011 and the inductor 2012. The switch 2044 in the adjustable output matching part 204 is opened to form an equivalent resistor 2044-2 having a small equivalent resistance, the equivalent resistor 2044-2 is connected in series with the capacitor 2042 and the capacitor 2043 and then connected in parallel with the choke inductor 2041, in this way, a total inductance may be equivalent to combination of the choke inductor 2041, the capacitor 2042 and the capacitor 2043. Furthermore, the switch 2048 is opened to form an equivalent resistor 2048-2 having a small equivalent resistance, the equivalent resistor 2048-2 is connected in series with the capacitor 2046 and then connected in parallel with the capacitor 2047 and then connected in series with the capacitor 2045, in this way, a total capacitance may be equivalent to a combination of the capacitor 2045, the capacitor 2046 and the capacitor 2047. The switch 2033 in the adjustable source degradation inductor part 203 is closed to form an equivalent capacitor 2033-2 having a small equivalent capacitance, the equivalent capacitor 2033-2 is connected in parallel with the inductor 2032 and then connected in series with the inductor 2031, in this way, a total inductance may be equivalent to the inductor 2031 and the inductor 2032. In this way, the adjustable input matching part 201 and the adjustable source degradation inductor part 203 operate together to achieve better matching of noise coefficient in a low band, while the adjustable output matching part 204 may achieve better gain and linearity in a low band.

Furthermore, the above method may be applied to a multi-band low-noise amplifier. According to the reconfigurable method of the disclosure, on the basis of an original structure of the adjustable input matching part 201, the adjustable input matching part 201 is added with a branch in which an inductor is connected in parallel with a switch and then connected in series with original parts, so as to achieve increase or decrease of inductance of multiple inductors. On the basis of an original structure of the adjustable output matching part 204, the choke inductor part is added with a branch in which an capacitor is connected in series with a switch and then connected in parallel with original parts, so as to achieve equivalent increase or decrease of inductance of multiple inductors, furthermore, the output capacitor part is added with a branch in which a capacitor is connected in series with a switch and then connected in parallel with original parts, so as to achieve equivalent increase or decrease of capacitance of multiple capacitors. On the basis of an original structure of the reconfigurable source degradation inductor part 203, the reconfigurable source degradation inductor part 203 is added with a branch in which an inductor is connected in series with a switch and then connected in parallel with original parts. In this way, the adjustable input matching part 201 and the adjustable source degradation inductor part 203 operate together to achieve matching of noise coefficient for multiple bands, while the adjustable output matching part may achieve optimal gain and linearity in multiple bands.

An embodiment of the disclosure provides another dual-band low-noise amplifier circuit, and the foregoing embodiments are illustrated and explained through this embodiment. Low-noise amplification of a dual-band signal may be achieved by a reconfigurable structure of the low-noise amplifier circuit, furthermore, it may be achieved that parameters such as noise coefficient, gain, linearity or the like are in optimal states in each band.

Figure 5:
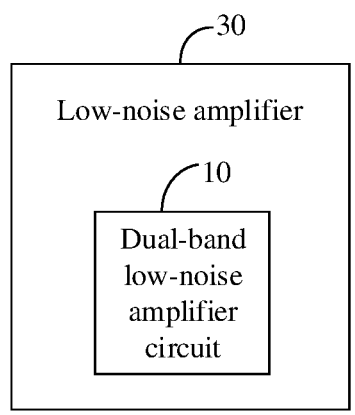
FIG. 5 is a schematic structural diagram of a low-noise amplifier provided by an embodiment of the disclosure.

In yet another embodiment of the disclosure, referring to FIG. 5, it shows a schematic structural diagram of a low-noise amplifier 30 provided by an embodiment of the disclosure. As shown in FIG. 5, the low-noise amplifier 30 includes at least the dual-band low-noise amplifier circuit 10 as described in the aforementioned embodiment, and low-noise amplification of a dual-band signal may be achieved by a reconfigurable structure of the low-noise amplifier circuit, furthermore, it may be achieved that parameters such as noise coefficient, gain, linearity or the like are in optimal states in each band.

Figure 6:
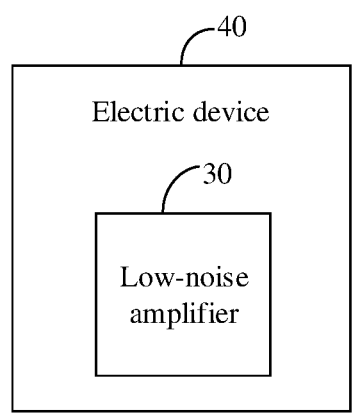
FIG. 6 is a schematic structural diagram of an electric device provided by an embodiment of the disclosure.

In yet another embodiment of the disclosure, referring to FIG. 6, it shows a schematic structural diagram of an electric device 40 provided by an embodiment of the disclosure. As shown in FIG. 6, the electric device 40 includes at least the low-noise amplifier 30 as described in the aforementioned embodiment, and low-noise amplification of a dual-band signal may be achieved by a reconfigurable structure of the low-noise amplifier circuit, furthermore, it may be achieved that parameters such as noise coefficient, gain, linearity or the like are in optimal states in each band.

It should be noted that in the disclosure, terms "including", "include" or any other variant thereof are intended to encompass non-exclusive inclusion, to allow a process, method, article or apparatus including a series of elements to include not only those elements, but also other elements which are not listed clearly or elements inherent to such process, method, article or apparatus. Without further limitation, an element defined by a phrase "including a . . . " does not preclude presence of additional identical elements in a process, method, article or apparatus including the element.

Serial numbers of the aforementioned embodiments of the disclosure are only intended for description, and do not represent advantages or disadvantages of the embodiments.

The methods disclosed in several method embodiments provided in the disclosure may be combined arbitrarily without conflict, to obtain new method embodiments.

The features disclosed in several product embodiments provided in the disclosure may be combined arbitrarily without conflict, to obtain new product embodiments.

The features disclosed in several method or device embodiments provided in the disclosure may be combined arbitrarily without conflict, to obtain new method embodiments or device embodiments.

The above descriptions are only specific implementations of the disclosure, however, the scope of protection of the disclosure is not limited thereto. Variation or replacement readily conceivable by any person skilled in the art within the technical scope of the disclosure shall fall within the scope of protection of the disclosure. Therefore, the scope of protection of the disclosure should be subjected to the scope of protection of the claims.

In the embodiment of the disclosure, the dual-band low-noise amplifier circuit includes an amplification sub-circuit and a switch frequency selection circuit. The amplification sub-circuit is configured to perform gain amplification on a to-be-amplified RF signal to obtain an amplified RF signal, and output the amplified RF signal. The switch frequency selection circuit is connected to the amplification sub-circuit, and is configured to control a state of a switch in the switch frequency selection circuit based on a target band corresponding to the to-be-amplified RF signal, such that the dual-band low-noise amplifier circuit meets optimal performance in the target band. In this way, low-noise amplification of a dual-band signal may be achieved by a reconfigurable structure of the dual-band low-noise amplifier circuit, furthermore, it may be achieved that parameters such as noise coefficient, gain, linearity or the like are in optimal states in each band.

What is claimed is:

1. A dual-band low-noise amplifier circuit, comprising:
an amplification sub-circuit configured to perform gain amplification on a to-be-amplified radio frequency (RF) signal to obtain an amplified RF signal, and output the amplified RF signal; and
a switch frequency selection circuit connected to the amplification sub-circuit, and configured to control a state of a switch in the switch frequency selection circuit based on a target band corresponding to the to-be-amplified RF signal, such that the dual-band low-noise amplifier circuit meets optimal performance in the target band;

wherein the switch frequency selection circuit comprises:
an input matching sub-circuit connected to an input end of the amplification sub-circuit, and configured to select an input matching mode corresponding to the target band, and transmit the to-be-amplified RF signal into the amplification sub-circuit based on the input matching mode;
an output matching sub-circuit connected to an output end of the amplification sub-circuit, and configured to select an output matching mode corresponding to the target band, and transmit the amplified RF signal based on the output matching mode; and
a degradation inductor sub-circuit connected to the input end of the amplification sub-circuit, and configured to select a degradation inductor mode corresponding to the target band, and perform the gain amplification on the to-be-amplified RF signal by cooperating with the amplification sub-circuit based on the degradation inductor mode;
wherein in response to the target band being a high frequency:
the input matching sub-circuit selects a first input mode, and transmits the to-be-amplified RF signal into the amplification sub-circuit based on the first input mode;
the output matching sub-circuit selects a first output mode, and transmits the amplified RF signal based on the first output mode; and
the degradation inductor sub-circuit selects a first degradation inductor mode, and performs the gain amplification on the to-be-amplified RF signal by cooperating with the amplification sub-circuit based on the first degradation inductor mode;
wherein in response to the target band being a low frequency:
the input matching sub-circuit selects a second input mode, and transmits the to-be-amplified RF signal into the amplification sub-circuit based on the second input mode;
the output matching sub-circuit selects a second output mode, and transmits the amplified RF signal based on the second output mode; and
the degradation inductor sub-circuit selects a second degradation inductor mode, and performs the gain amplification on the to-be-amplified RF signal by cooperating with the amplification sub-circuit based on the second degradation inductor mode;
wherein the output matching sub-circuit comprises:
a choke capacitor component comprising at least a choke inductor and a third capacitor bank connected in parallel, wherein the third capacitor bank comprises at least a third capacitor and a third connection switch configured to control electrical parameters by which the third capacitor bank affects the choke capacitor component; and an output capacitor component comprising a fourth capacitor and a fifth capacitor bank connected in series, wherein the fifth capacitor bank comprises at least a fifth capacitor and a fourth connection switch configured to control electrical parameters by which the fifth capacitor bank affects the output capacitor component;
wherein in response to the third connection switch being in an opening state and the fourth connection switch being in an opening state, it is confirmed that the output matching sub-circuit is in the first output mode; or
in response to the third connection switch being in a closed state and the fourth connection switch being in a closed state, it is confirmed that the output matching sub-circuit is in the second output mode.

2. The dual-band low-noise amplifier circuit of claim 1, wherein the input matching sub-circuit comprises at least a first inductor and a first bypass switch, and wherein the first inductor is controlled to be in a bypass or normal state by controlling a closed or opening state of the first bypass switch.

3. The dual-band low-noise amplifier circuit of claim 2, wherein in response to the first bypass switch being in the closed state, it is confirmed that the input matching sub-circuit is in the first input mode; or
in response to the first bypass switch being in the opening state, it is confirmed that the input matching sub-circuit is in the second input mode.

4. The dual-band low-noise amplifier circuit of claim 1, wherein the degradation inductor sub-circuit comprises at least a second inductor and a second bypass switch, and wherein the second inductor is controlled to be in a bypass or normal state by controlling a closed or opening state of the second bypass switch.

5. The dual-band low-noise amplifier circuit of claim 4, wherein in response to the second bypass switch being in the closed state, it is confirmed that the degradation inductor sub-circuit is in the first degradation inductor mode; or
in response to the second bypass switch being in the opening state, it is confirmed that the degradation inductor sub-circuit is in the second degradation inductor mode.

6. The dual-band low-noise amplifier circuit of claim 1, further comprising a direct current (DC) blocking capacitor connected between the input matching sub-circuit and the amplification sub-circuit.

7. The dual-band low-noise amplifier circuit of claim 1, wherein the amplification sub-circuit comprises two amplification transistors connected through a cascode structure.

8. A low-noise amplifier, comprising at least the dual-band low-noise amplifier circuit of claim 1.

9. An electronic device, comprising at least the low-noise amplifier of claim 8.

* * * * *